(12) United States Patent
Horie

(10) Patent No.: US 6,927,706 B2
(45) Date of Patent: Aug. 9, 2005

(54) DATA COMPRESSING APPARATUS AND DATA DECODING APPARATUS

(75) Inventor: Kimito Horie, Tokyo (JP)

(73) Assignee: Oki Electric Industrial, Co., LTD, Tokyo (JP)

( * ) Notice: Subject to any disclaimer, the term of this patent is extended or adjusted under 35 U.S.C. 154(b) by 0 days.

(21) Appl. No.: 10/784,287

(22) Filed: Feb. 24, 2004

(65) Prior Publication Data

US 2004/0164883 A1 Aug. 26, 2004

(30) Foreign Application Priority Data

Feb. 24, 2003 (JP) .................................... 2003-045601

(51) Int. Cl.[7] .............................................. H03M 7/34
(52) U.S. Cl. ........................................ 341/51; 341/50
(58) Field of Search .............................. 341/50, 51, 55, 341/106

(56) References Cited

U.S. PATENT DOCUMENTS

| | | | | |
|---|---|---|---|---|
| 5,339,076 A | * | 8/1994 | Jiang | 341/51 |
| 5,778,255 A | * | 7/1998 | Clark et al. | 710/68 |
| 5,929,791 A | * | 7/1999 | Masenas | 341/51 |
| 6,271,775 B1 | * | 8/2001 | Jaquette et al. | 341/87 |

FOREIGN PATENT DOCUMENTS

| | | |
|---|---|---|
| JP | 5-241777 | 9/1993 |
| JP | 7-273667 | 10/1995 |
| JP | 2000-315954 | 11/2000 |

* cited by examiner

Primary Examiner—Michael Tokar
Assistant Examiner—Linh V Nguyen
(74) Attorney, Agent, or Firm—Wenderoth, Lind & Ponack, L.L.P.

(57) ABSTRACT

A data compressing apparatus outputs character data and a pointer as intermediate data from input data. When a character string as a target of a command coincides with a character string as a target of the character data and a character string that is instructed by the pointer or by a combination thereof, a substituting means outputs a command in place of the character data or the pointer and outputs output data including the character data, the pointer, and the command. Accordingly, a data compressing apparatus is realized which can make free compression such that information or the like other than the character string is embedded.

14 Claims, 19 Drawing Sheets

Fig.2

Input stream for encoding:

Pos  1 2 3 4 5 6 7 8 9 10 11

Char  A A B B C B B A A B C

Table 1:

The encoding process (MIN_LENGTH=2)

| Step | Pos | Match | Output |
|---|---|---|---|
| 1 | 1 | – | A |
| 2 | 2 | A | A |
| 3 | 3 | – | B |
| 4 | 4 | B | B |
| 5 | 5 | – | C |
| 6 | 6 | BB | (3,2) |
| 7 | 8 | AAB | (7,3) |
| 8 | 11 | C | C |

Fig.3

<Compressed Stream> := [<Compressed String>] <End Marker>
                101                       102         103

<Compressed String> := 0 <Raw Byte> |1 <Compressed Bytes>
                                      104                 105

<Raw Byte> := <b><b><b><b><b><b><b><b> (8-bit byte)
<Compressed Bytes> := <Offset><Length>
                            106   107

<Offset> :=1 <b><b><b><b><b><b><b> (7-bit offset)
0 <b><b><b><b><b><b><b><b> <b><b><b> (11-bit offset)

<End Marker> := 110000000

<b> := 1 | 0

<Length> :=
00 = 2                    1111 0110 = 14
01 = 3                    1111 0111 = 15
10 = 4                    1111 1000 = 16
1100 = 5                  1111 1001 = 17
1101 = 6                  1111 1010 = 18
1110 = 7                  1111 1011 = 19
1111 0000 = 8             1111 1100 = 20
1111 0001 = 9             1111 1101 = 21
1111 0010 = 10            1111 1110 = 22
1111 0011 = 11            1111 1111 0000 = 23
1111 0100 = 12            1111 1111 0001 = 24

1111 0101 = 13 ···

Fig.4
(a) ADDITION OF COMMAND
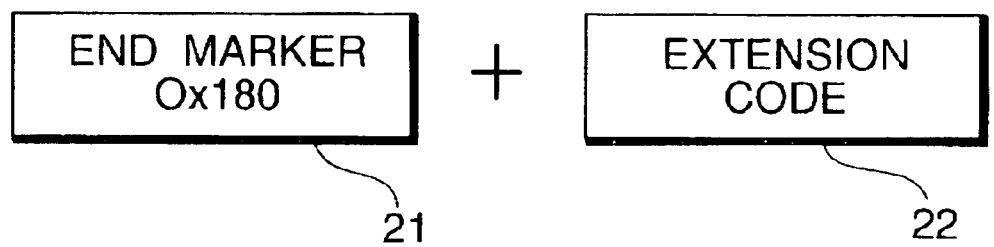
(b) EXPANSION OF COMMAND
(CONTENTS OF EXTENSION CODE)
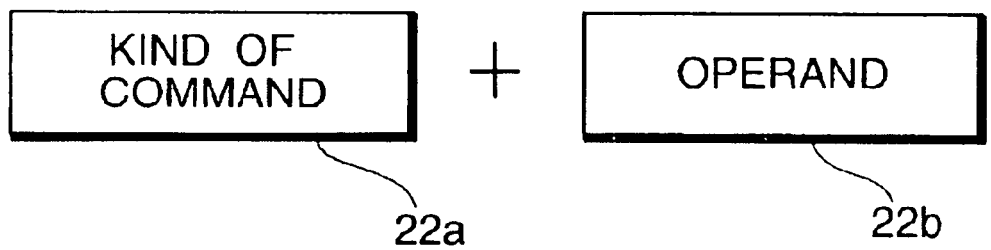

Fig. 5

| KIND OF COMMAND | CODE | MEANING |
|---|---|---|
| END MARKER | 0x180 + 0x0 | END OF OUTPUT DATA |
| DATA CONTROL COMMAND | 0x180 + 0x1 + (B,L,N) | THE L CHARACTER DATA STRINGS FROM A POSITION BEFORE B STRINGS ARE REPEATED N TIMES. |
| POINTER CONTROL COMMAND | 0x180 + 0x2 + (B,L) | THE POINTER FROM A POSITION BEFORE B POINTERS IS REPEATED N TIMES. |
| OUTPUT DATA STRING CONTROL COMMAND | 0x180 + 0x3 + (B,L,N) | THE L OUTPUT DATA STRINGS FROM A POSITION BEFORE B STRINGS ARE REPEATED N TIMES. |
| DATA CONTROL COMMAND | 0x180 + 0x4 + (B,L,M,C) | THE MTH DATA OF THE L CHARACTER DATA STRINGS FROM A POSITION BEFORE B STRINGS IS CHANGED TO C AND OUTPUTTED. |
| POINTER CONTROL COMMAND | 0x180 + 0x5 + (B1,B2) | THE CHARACTER DATA STRINGS INDICATED BY THE POINTERS P1 AND P2 ARE COUPLED AND OUTPUTTED. |
| ----- | ----- | ----- |
| PASSWORD SETTING COMMAND | 0x180 + 0xD + (PW) | THE PASSWORD PW IS SET. |
| COPYRIGHT INFORMATION SETTING COMMAND | 0x180 + 0xE + (CR) | THE COPYRIGHT INFORMATION CR IS SET. |
| SCM COMMAND | 0x180 + 0xF + (CM) | THE COMMENT CM IS INSERTED. |

NOTE: B: 7 BITS, N: 4 BITS, L: 8 BITS, M: 8 BITS, C: 8 BITS.

Fig. 7

(1) SUBSTITUTION OF POINTERS INDICATING THE SAME CHARACTER STRING:

WHEN THE POINTERS P1 AND P2 INDICATING THE SAME CHARACTER STRING C ARE DETECTED, THE LATTER POINTER P2 IS REPLACED WITH THE COMMAND RP(B, L) IN WHICH THE FORMER POINTER P1 IS REPEATED.
「....C..P1..P2....」 → 「....C..P1..RP....」

(2) SUBSTITUTION OF 2 ADJACENT POINTERS:

THE 2 ADJACENT POINTERS P1 AND P2 ARE REPLACED WITH ONE COMMAND CP(B1, L1, B2, L2) FOR COUPLING THE 2 POINTERS.
「....P1P2....」 → 「....CP....」

(3) SUBSTITUTION OF POINTER INDICATING THE CHARACTER STRING INCLUDING ONE DIFFERENT CHARACTER

WHEN THE POINTER P2 INDICATING THE CHARACTER STRING C2 IN WHICH ONE CHARACTER DIFFERS FROM THAT IN THE POINTER P1 INDICATING THE CHARACTER STRING C1 IS DETECTED, THE LATTER POINTER P2 IS REPLACED WITH THE COMMAND OMD(B, L, M, C) FOR CHANGING THE ONE DIFFERENT CHARACTER IN THE CHARACTER STRING C1 OF THE FORMER POINTER P1.
「....C1..C2..P1..P2....」 → 「....C1..C2..P1..OMD....」

Fig.8

(a) INPUT CHARACTER STRINGS

| ABC ABC ABC ABC ABC ABC D...... |
|---|

(24) (24) (24) (24) (24) (24)  144 BITS IN TOTAL (b) OUTPUT DATA ACCORDING TO LZSS

| ABC (3,3) (6,6) (12,6) D...... |
|---|

(27) (11) (13) (13)  64 BITS IN TOTAL (c) OUTPUT DATA ACCORDING TO EMBODIMENT OF THE INVENTION

| ABC (3,3) RP(1,4) D...... |
|---|

(24) (11) (24)  62 BITS IN TOTAL (d) OUTPUT DATA ACCORDING TO EMBODIMENT OF THE INVENTION

| ABC RD(3,3,5) D...... |
|---|

(27) (32)  59 BITS IN TOTAL

Fig.10

<Compressed Stream> := [<Compressed String>] <End Marker>
                         201              202              203

<Compressed String> := 0 <Raw Byte> | 1 <Command/Pointer>
                                204                205

<Raw Byte> := <b><b><b><b><b><b><b><b> (8-bit byte)

<Command/Pointer> := 1 <Command> | 0 <Pointer>
                             206            207

<Command> := <Command Set><Operand>
                    208            209

<Command Set> := <b><b><b><b> (4-bit)
<End Marker> := 110000

<Pointer> := <Offset><Length>
                 210      211

<Offset> :=
1<b><b><b><b><b><b><b> (6-bit offset)
0 <b><b><b><b><b><b><b><b> <b><b><b> (11-bit offset)

<b> := 1 | 0

<Length> :=
| | |
|---|---|
| 00 = 2 | 1111 0110 = 14 |
| 01 = 3 | 1111 0111 = 15 |
| 10 = 4 | 1111 1000 = 16 |
| 1100 = 5 | 1111 1001 = 17 |
| 1101 = 6 | 1111 1010 = 18 |
| 1110 = 7 | 1111 1011 = 19 |
| 1111 0000 = 8 | 1111 1100 = 20 |
| 1111 0001 = 9 | 1111 1101 = 21 |
| 1111 0010 = 10 | 1111 1110 = 22 |
| 1111 0011 = 11 | 1111 1111 0000 = 23 |
| 1111 0100 = 12 | 1111 1111 0001 = 24 |

1111 0101 = 13 ···

Fig.11
(a) ADDITION OF COMMAND
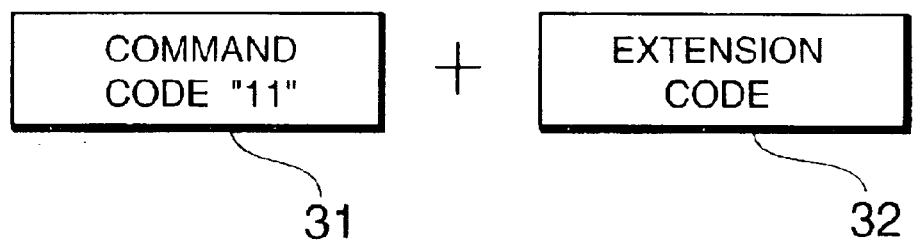
(b) EXPANSION OF COMMAND
(CONTENTS OF EXTENSION CODE)
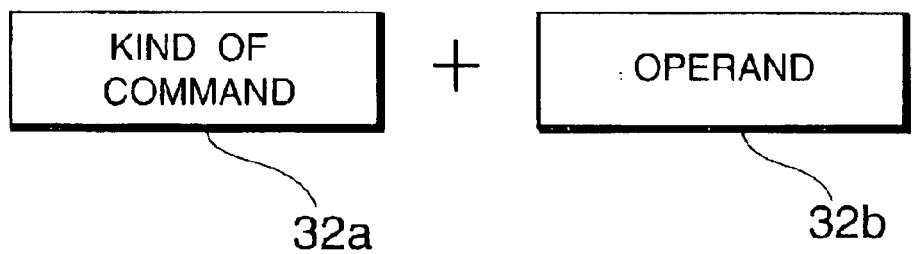

Fig.12

| KIND OF COMMAND | CODE | MEANING |
|---|---|---|
| END MARKER | 「11」 + 0x0 | END OF OUTPUT DATA |
| DATA CONTROL COMMAND | 「11」 + 0x1 + (B,L,N) | THE L CHARACTER DATA STRINGS FROM A POSITION BEFORE B STRINGS ARE REPEATED N TIMES. |
| POINTER CONTROL COMMAND | 「11」 + 0x2 + (B,L) | THE POINTER FROM A POSITION BEFORE B POINTERS IS REPEATED N TIMES. |
| OUTPUT DATA STRING CONTROL COMMAND | 「11」 + 0x3 + (B,L,N) | THE L OUTPUT DATA STRINGS FROM A POSITION BEFORE B STRINGS ARE REPEATED N TIMES. |
| DATA CONTROL COMMAND | 「11」 + 0x4 + (B,L,M,C) | THE MTH DATA OF THE L CHARACTER DATA STRINGS FROM A POSITION BEFORE B STRINGS IS CHANGED TO C AND OUTPUTTED. |
| POINTER CONTROL COMMAND | 「11」 + 0x5 + (B1,B2) | THE CHARACTER DATA STRINGS INDICATED BY THE POINTERS P1 AND P2 ARE COUPLED AND OUTPUTTED. |
| ----- | ----- | ----- |
| PASSWORD SETTING COMMAND | 「11」 + 0xD + (PW) | THE PASSWORD PW IS SET. |
| COPYRIGHT INFORMATION SETTING COMMAND | 「11」 + 0xE + (CR) | THE COPYRIGHT INFORMATION CR IS SET. |
| SCM COMMAND | 「11」 + 0xF + (CM) | THE COMMENT CM IS INSERTED. |

NOTE: B: 7 BITS, N: 4 BITS, L: 8 BITS, M: 8 BITS, C: 8 BITS.

Fig. 13

| KIND OF COMMAND | CODE | MEANING |
|---|---|---|
| CHARACTER STRING DEFINITION COMMAND | 「11」 + 0x8 + (B,L,M) | THE L CHARACTER STRINGS FROM A POSITION BEFORE B STRINGS IS DESIGNATED AS THE MTH CHARACTER STRING. |
| CHARACTER STRING DEFINITION OUTPUT COMMAND | 「11」 + 0x9 + (B,L,M) | THE L CHARACTER DATA STRINGS FROM A POSITION BEFORE B STRINGS IS DESIGNATED AS THE MTH CHARACTER DATA STRING AND THIS CHARACTER STRING IS OUTPUTTED. |
| POINTER DEFINITION COMMAND | 「11」 + 0xA + (M) | THE POINTER JUST BEFORE IS DESIGNATED AS THE MTH POINTER. |
| CODE SUBSTITUTION COMMAND | 「11」 + 0xB + (M) | THE MTH CHARACTER STRING DESIGNATED BY THE CS COMMAND OR THE LIKE IS REPLACED WITH THE CODE. |

NOTE: B: 7 BITS, L; 8 BITS, M: 5 BITS.

Fig. 14

(a) STOP ACCORDING TO THE ORDER

| ORDER (M) | CHARACTER STRING | POINTER | FREQUENCY OF APPEARANCE (T) |
|---|---|---|---|
| 1 | S1 | P1 | 18 |
| 2 | S2 | P2 | 12 |
| 3 | S3 | P3 | 10 |
| 4 | S4 | P4 | 9 |
| ⋮ | ⋮ | ⋮ | ⋮ |
| 31 | S31 | P31 | 4 |
| 32 | S32 | P32 | 4 |
| 33 | S33 | P33 | 4 |

STOP ON THE BASIS OF THE ORDER M

(a) STOP ON THE BASIS OF THE FREQUENCY OF APPEARANCE

| ORDER (M) | CHARACTER STRING | POINTER | FREQUENCY OF APPEARANCE (T) |
|---|---|---|---|
| 1 | S1 | P1 | 12 |
| 2 | S2 | P2 | 8 |
| 3 | S3 | P3 | 7 |
| 4 | S4 | P4 | 6 |
| ⋮ | ⋮ | ⋮ | ⋮ |
| 16 | S16 | P16 | 3 |
| 17 | S17 | P17 | 2 |
| 18 | S18 | P18 | 2 |

STOP ON THE BASIS OF THE FREQUENCY T

Fig.15

$$\begin{cases} \text{DISCRIMINATING CONDITION 1: THE NUMBER OF CHARACTERS} \\ \qquad\qquad\qquad\qquad\qquad\text{OF S1 IS THE SAME.} \\ \text{DISCRIMINATING CONDITION 2: Cadr-Padr=OffsetadrC-OffsetadrP} \end{cases}$$

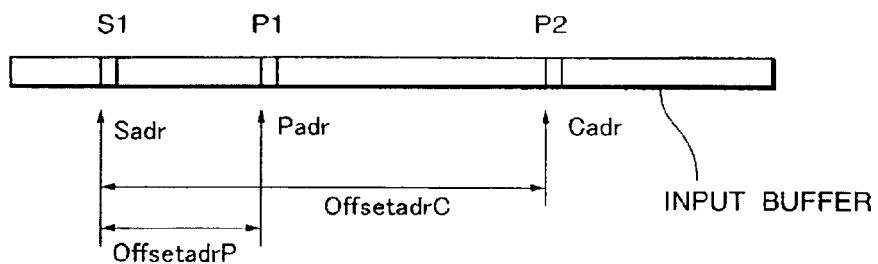

S1: CHARACTER STRING
P1: POINTER SHOWING S1
P2: POINTER SHOWING S1
Sadr,Padr,Cadr:RELATIVE ADDRESSES IN INPUT BUFFER
OffsetadrP,OffsetadrC:RELATIVE ADDRESSES SHOWING OFFSET VALUES

Fig. 16

| DESIGNATED ORDER (M) | DEFINITION COMMAND | VALID/INVALID FLAG |
|:---:|:---:|:---:|
| 1 | SDO(B,L,M) | 1 |
| 2 | SD(B,L,M) | 1 |
| 3 | PD(B,L,M) | 1 |
| 4 | SDO(B,L,M) | 1 |
| ⋮ | | ⋮ |
| 16 | SDO(B,L,M) | 1 |
| 17 | — | 0 |
| ⋮ | ⋮ | ⋮ |
| 32 | — | 0 |

Fig. 17

<Compressed Stream> := [<Compressed String>] <End Marker>
                   301                   302        303

<Compressed String> := 0 <Raw Byte> | 1 <Command/Pointer>
                                304            305

<Raw Byte> := <b><b><b><b><b><b><b><b> (8-bit byte)

<Command/Pointer> := 1 <Command> | 0 <Pointer>
                          306      307

<Command> := <Command Set><Operand>
               308        309

312 {
<Command Set> :=
00 = 1 (CS COMMAND) — 314
01 = 2 (SDO COMMAND) — 315
10 = 3 (PD COMMAND) — 316
1100 = 4
1101 = 5
1110 = 6
1111 0000 = 7    1111 0111 = 12
1111 0001 = 8    1111 1110 = 13
1111 0010 = 9    1111 1111 = 14
1111 0011 = 10   1111 1000 = 15
1111 0100 = 11   ...

<End Marker> := 1111 1111 = 22 (END COMMAND) — 317

313 {
<Operand> :=
M := 318 {
00 = 1
01 = 2
10 = 3
1100 = 4
1101 = 5
...
1111 1111 = 22
B := ...

<Pointer> := <Offset><Length>
               310   311

<Offset> :=
1<b><b><b><b><b><b><b> (6-bit offset)
0 <b><b><b><b><b><b><b><b> <b><b><b> (11-bit offset)

<b> := 1 | 0

<Length> :=
00 = 2          1111 0110 = 14
01 = 3          1111 0111 = 15
10 = 4          1111 1000 = 16
1100 = 5       1111 1001 = 17
1101 = 6       1111 1010 = 18
1110 = 7       1111 1011 = 19
1111 0000 = 8   1111 1100 = 20
1111 0001 = 9   1111 1101 = 21
1111 0010 = 10   1111 1110 = 22
1111 0011 = 11   1111 1111 0000 = 23
1111 0100 = 12   1111 1111 0001 = 24

1111 0101 = 13 ...

Fig.19
(a) IN THE CASE OF DEFINING ONE POINTER
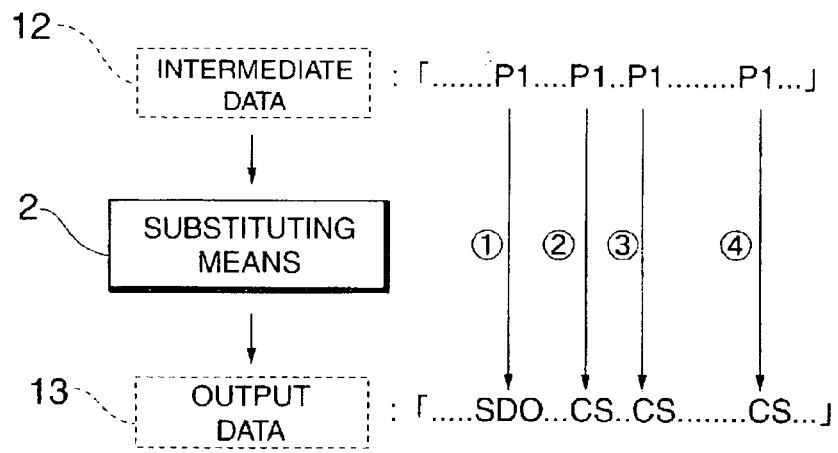
(b) IN THE CASE OF DEFINING A PLURALITY OF POINTERS
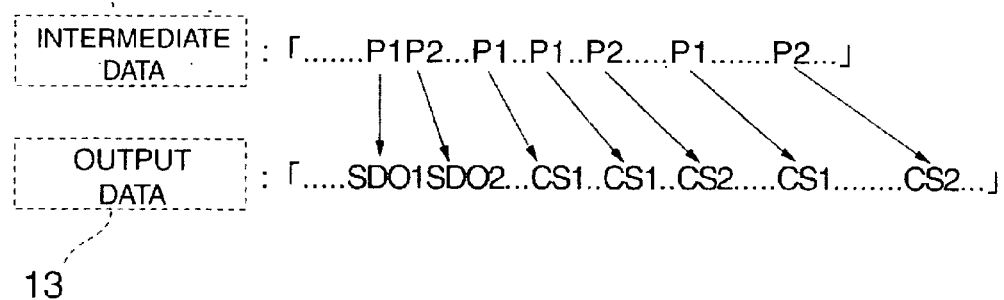

DATA COMPRESSING APPARATUS AND DATA DECODING APPARATUS

BACKGROUND OF THE INVENTION

1. Field of the Invention

The present invention relates to a data compressing apparatus and a data decoding apparatus in which a data compressing/decoding method such as LZSS or the like is expanded.

2. Related Background Art

A technique for transmitting data via a network in a short amount of time has been developed in association with the recent spread of the Internet. A data compression method intends to accomplish such an object by reducing the data itself to be transmitted.

In such a compression method, among lossless data compression methods, an origin of a dictionary coding which is most frequently used at present is a Lempel-Ziv encoding method that was created by Abraham Lempel and Jacob Ziv in 1977, and this encoding method is called a slide dictionary coding, LZ77, or the like. According to the LZ77, an input character data string which has been encoded before is used as a dictionary, and the longest coincidence with a continuous portion in the input character data string is searched, thereby encoding coincidence information. Since the LZ77 employs a null-pointer and since the first character which is outputted after the matching can be also used for the next matching, there is no need to output in such a case, and therefore, there is only a slight redundancy. After that, as a method of improving this encoding method, Storer and Szymanski created a data compression method called LZSS. Various techniques using such LZSS have been proposed (for example, refer to JP-A-5-241777, JP-A-7-273667, and JP-A-2000-315954).

The LZSS is a method whereby the pointer is outputted only when the character string is longer than a predetermined pointer length, and, in the other cases, the character data is outputted. Therefore, according to encoding in the LZSS, since the data in a form such that the encoded character data and pointer are mixed is outputted, and a specific bit (an extra ID-bit) is used to distinguish the character data and the pointer which are being outputted.

It has been known that when a compression ratio of the LZSS is compared with that of another compression method, the compression ratio to, particularly, character data having regularity is high. There is also a feature such that the decoding in the LZSS is performed at a high speed. For example, a large effect is obtained particularly in the case where the pointer is encoded by a method that is combined with the other entropy methods.

However, since the conventional data compression method is constructed by the character data and the pointer, it is difficult to embed data other than the character data, for example, information such as password or copyright information. Since the conventional data compression method is constructed only by the character data and the pointer, there is a limitation in the case of accomplishing a more excellent compression ratio in the range of those means.

SUMMARY OF THE INVENTION

It is therefore an object of the present invention to output raw data, a pointer, and a command from a data string in order to solve the foregoing problems and to realize a data compressing apparatus which can perform free compression.

That is, when the data string as a target of the command coincides with a data string as a target of the raw data and a data string that is indicated by the pointer or a combination of them, the command is outputted by being replaced with the raw data or the pointer.

According to the present invention, there is provided a data compressing apparatus for outputting raw data, a pointer, and a command from a data string. The data compressing apparatus comprises substituting means which outputs the command in place of the raw data or the pointer when a data string as a target of the command coincides with a data string as a target of the raw data and a data string that is indicated by the pointer or a combination thereof.

The data compressing apparatus may further comprise substituting means which, when a code length which is assigned to the command is shorter than a length of data comprising the raw data and the pointer, replaces the raw data or the pointer serving as a source with the command.

In the data compressing apparatus, the command is constructed by a command code and an extension code.

Further, in the data compressing apparatus, the extension code is constructed by a code which is indicative of a kind of command and an operand.

Moreover, in the data compressing apparatus, a first bit is used to distinguish the raw data, the pointer, and the command, and a second bit is used to distinguish the pointer and the command. In this case, as a first aspect, the data compressing apparatus may further comprise a substituting means which, when each of a plurality of commands is constructed by a kind of command and an operand, executes encoding for gradually increasing a code length in accordance with the kind of each command. As a second aspect, the data compressing apparatus may further comprise a substituting means which, when each of a plurality of commands is constructed by a kind of command and an operand, executes encoding for gradually increasing the code length in accordance with a parameter of each operand.

The data compressing apparatus may further comprise substituting means which executes, for each predetermined data unit, a process for, when a data string that is designated by a specific pointer coincides with data strings that are designated by a plurality of other pointers, replacing the specific pointer with a definition command and replacing the plurality of other pointers with the code substitution command corresponding to the definition command.

In the data compressing apparatus, from among the data strings existing in the predetermined data unit, the data string which appears first is selected as a data string which is designated by the specific pointer.

In this case, the data compressing apparatus may further comprise a substituting means which, when a plurality of definition commands are set, counts the frequencies of appearance, in the predetermined data unit, of a plurality of data strings which are designated by the pointer that is replaced with the plurality of definition commands and forms a definition table in which the definition commands have been disclosed in the order of the frequencies of appearance.

In the data compressing apparatus, the definition table is newly formed for each predetermined data unit.

The data compressing apparatus may further comprise substituting means which discriminates (determines) whether or not a data amount of the data string that is designated by the specific pointer coincides with a data amount of data string that is designated by the other pointer, discriminates whether or not a difference between an address of the data string that is designated by the specific pointer in the predetermined data unit and an address of the data string that is designated by the other pointer coincides with a 1.5 difference between an offset value which the specific pointer has and an offset value which the other pointer has, and if they coincide, determines that the data string that is designated by the specific pointer coincides with the data string that is designated by the other pointer.

According to the present invention, there is provided a data decoding apparatus, wherein when data including raw data, a pointer, and a command is inputted, the command is executed, the data is returned to the raw data or the pointer, and the raw data or the pointer is returned to a target data string.

Further, according to the present invention, there is provided a data decoding apparatus, wherein when data which has been compressed each predetermined data unit is given in a manner such that when a data string which is data including raw data, a pointer, and a command and is designated by a specific pointer coincides with data strings that are designated by a plurality of other pointers, the specific pointer is replaced with a definition command and the plurality of other pointers are replaced with a code substitution command corresponding to the definition command, the code substitution command is returned to the definition command, the definition command is returned to the raw data or the pointer, and the raw data or the pointer is returned to the data string as a target for each the predetermined data unit.

The above and other objects and features of the present invention will become apparent from the following detailed description and the appended claims with reference to the accompanying drawings.

BRIEF DESCRIPTION OF THE DRAWINGS

FIG. 2 is an explanatory diagram of the encoding of the LZSS;

FIG. 3 is an explanatory diagram of the encoding which is used in the LZSS or the like;

FIG. 4 is an explanatory diagram showing a fundamental construction of a command in the first embodiment;

FIG. 5 is an explanatory diagram showing an example of the creation of the command in the first embodiment;

FIG. 7 is an explanatory diagram of a substitution to the command;

FIG. 8 is an explanatory diagram of output data in the first embodiment;

FIG. 10 is an explanatory diagram of the encoding of a second embodiment of the present invention;

FIG. 11 is an explanatory diagram showing a construction of a command in the second embodiment;

FIG. 12 is an explanatory diagram of an example of the creation of the command in the second embodiment;

FIG. 13 is an explanatory diagram showing an example of the creation of a command in a third embodiment of the present invention;

FIG. 14 is an explanatory diagram showing a relationship between a frequency of appearance of the same character string and the encoding in a certain input buffer;

FIG. 15 is an explanatory diagram showing discriminating means for discriminating whether or not the pointer is the same pointer;

FIG. 16 is an explanatory diagram showing an example of the creation of a definition table of character strings and the like;

FIG. 17 is an explanatory diagram showing an example of encoding in the third embodiment;

FIG. 19 is an explanatory diagram of the setting of a code substitution command.

DETAILED DESCRIPTION OF THE PREFERRED EMBODIMENTS

Figure 1:
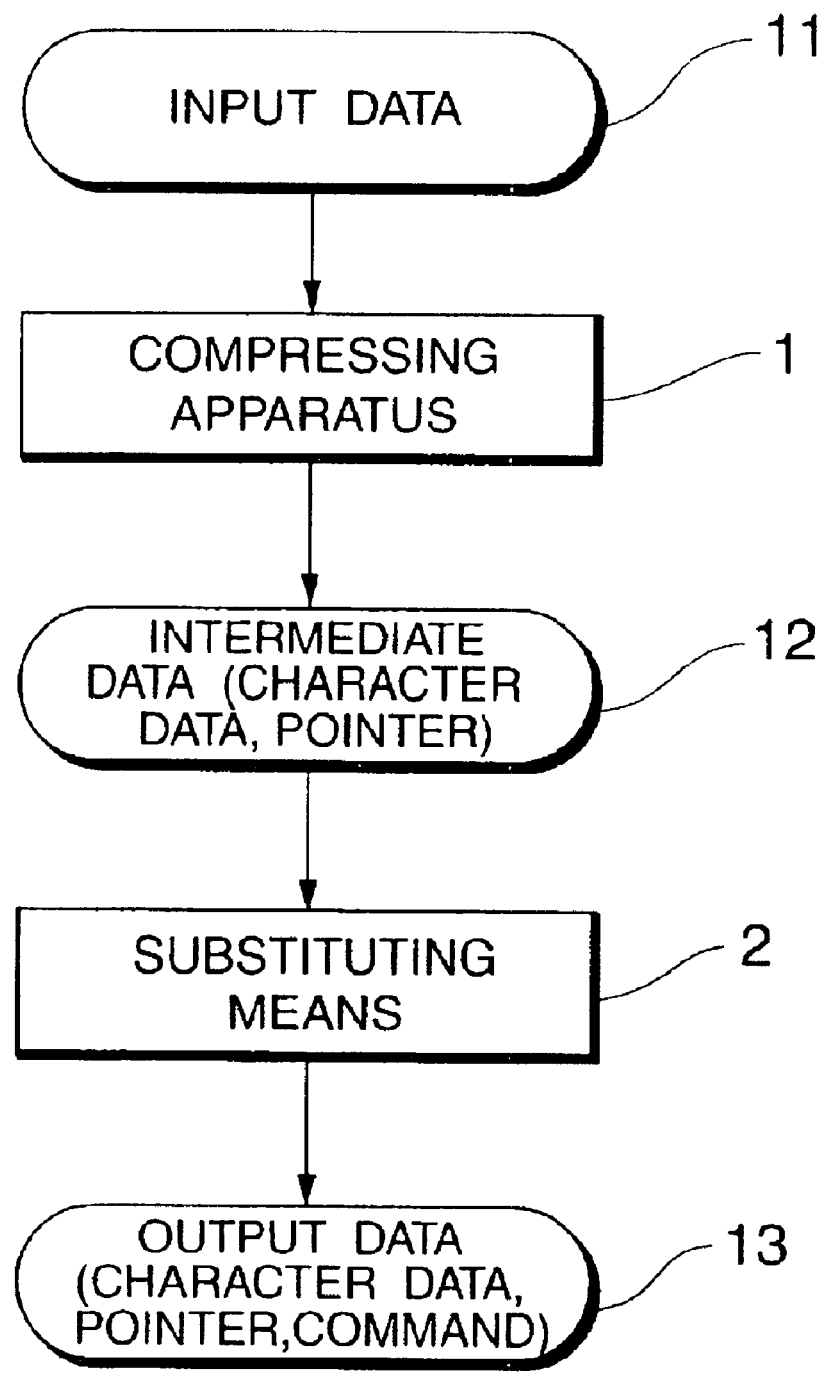
FIG. 1 is a constructional diagram of a data compressing apparatus in a first embodiment of the present invention.

Embodiments of the invention will be described in detail hereinbelow with reference to the drawings.

First, a principle of the invention will be explained prior to the description of the embodiments.

To solve the foregoing problems, the present invention provides a data compressing apparatus in which, in addition to character data and a pointer, a command is newly added to an output data string and the character data or the pointer and, further, the command itself is controlled, thereby realizing the addition of a new function and the improvement of a compression ratio as a whole.

As mentioned above, the data compressing apparatus of the present invention has a feature such that, in addition to the character data and the pointer, the command is newly added to the compressed data. Although the command can be variably defined, the command is fundamentally used to output the character data. For example, according to a pointer repetition command, the relevant pointer is repeated a plurality of number of times so that the character data, as an output of the pointer, is repetitively outputted a plurality of number of times. If the number of repeating times is small and the number of character data which is outputted at a time is small, a data amount increases due to the addition of the above command, and therefore, there is a case where the compression ratio decreases. According to the present invention, a mode in which the command is not added (refer to the operation in step S4 in the first embodiment, which will be explained hereinafter) is selected in such a case. Therefore, in principle, according to the present invention, the compression ratio is not reduced to a value which is lower than that of the conventional LZSS or the like. There is an exceptional case where the decrease in compression ratio is permitted in order to embed copyright information or the like. It should be noted that even in the case where the command is added or not added, the decoded data output is not changed at all. The embedded copyright information or the like does not directly change the data output at all. It should always be noted in the case of expanding the conventional compression method.

The above-described principle in the data compression intends to establish a new viewpoint for which the data compression changes the sequential character string to a "program" by stepping up from a direct viewpoint that the data compression changes the sequential character string to the sequential character data and pointer similar to a conventional method. The first step in such a viewpoint will be easily understood by considering that the pointer is a kind of command. A pointer (B, L) in the compression method such as the LZSS or the like denotes that the character string of L characters is outputted from a position where the character string is traced back by B characters, as will be explained below. The pointer is really a kind of command. In the field of semiconductors, a method of describing a logic circuit by a program has been utilized and a language such as Velilog or the like has been known. According to such a language, a circuit structure is outputted as a program. In the present invention, a data structure is outputted as a program.

FIG. 1 shows a construction in which an additional encoder (corresponding to a substituting means 2 in FIG. 1) is introduced when the data compressing apparatus of the present invention is embodied. Details of this construction will be explained hereinafter. According to the data compressing apparatus shown in FIG. 1, input data 11 (a character string) in an input buffer is converted into sequential character data and a pointer by a compressing apparatus 1 corresponding to the conventional compressing apparatus and outputted to an intermediate buffer. Thereafter, the sequential character data and the pointer are further converted into output data 13 including the sequential character data and the pointer by the additional encoder (substituting means 2), which is introduced in the present invention, and outputted to an output buffer. The conventional compressing apparatus 1 can be also considered as being included into the additional encoder introduced in the present invention. The output of the sequential character data, pointer, and command is really nothing but the creation of the program.

The encoding of the LZSS will now be described as an example of the data compression method of outputting the character data and the pointer from a character string.

FIG. 2 is an explanatory diagram of the encoding of the LZSS.

FIG. 2 shows an example in which a character string "AABBCBBAABC" is encoded by 2 bytes of a pointer length. In such a case, the encoding is executed in the LZSS as follows.

(1) Since the first character "A" of the character string is the first character and is not a target of compression, the raw data "A" is outputted as character data.

(2) Although the second character "A" of the character string coincides with the first character "A" in (1) which has already appeared, since the pointer length is equal to 2 bytes and a coincidence of 2 bytes is not be obtained, the raw data "A" is also outputted as it is as character data in this case.

(3) The third character "B" of the character string is a character which newly appeared and is handled in a manner similar to (1).

(4) The fourth character "B" of the character string is a character which appeared just before and is handled in a manner similar to (2).

(5) The fifth character "C" of the character string is a character which newly appeared and is handled in a manner similar to (1).

(6) Although the sixth character "B" of the character string is a character which appeared before, when it is combined with the subsequent seventh character "B", the combined characters coincide with "BB". In this case, since the characters coincide with respect to 2 or more bytes of the pointer length and a character string "BBA" combined with the eighth character "A" of the character string does not appear yet, a pointer (3, 2) is outputted. The pointer (B, L) denotes that the character string of L characters is outputted from a position where the character string is traced back by B characters.

(7) Since a character string "AAB" starting with the ninth character of the character string coincides with the three character strings starting from the first character and its length is equal to or longer than the pointer length of 2 bytes, a pointer (7, 3) is outputted.

(8) Although the 11th character "C" of the character string is a character which appeared before, since it is shorter than the pointer length, it is handled in a manner similar to (2).

FIG. 3 is an explanatory diagram of the encoding which is used in the LZSS or the like.

The encoding intends to assign a code of a short code length to a pointer of a short data length whose frequency of appearance is high.

In FIG. 3, output data (Compressed Stream) 101 is constructed by a compressed data string (Compressed String) 102 and an end marker (End Marker) 103. The Compressed String 102 is a set of a head bit (equal to 0) and raw data (Raw Byte) 104, or a set of a head bit (equal to 1) and a compression code (Compressed Bytes) 105. "The head bit" denotes the specific bit (extra ID-bit) mentioned above.

Although the Raw Byte 104 is constructed by 8 bits (1 byte) like ASCII, the Compressed Bytes 105 is constructed by an offset (Offset) 106 and a code length (Length) 107. That is, the Offset and the Length correspond to B and L of the pointer (B, L) mentioned above. As an Offset 106, a 7-bit offset (8 bits in total) whose head bit is equal to 1 or a 11-bit offset (12 bits in total) whose head bit is equal to 0 is prepared in consideration of encoding efficiency. That is, when a value of the offset is small, the 7-bit offset is used, and if the offset cannot be expressed by the 7-bit offset, the 11-bit offset is used. The 11-bit offset is based on 2 kbytes as a capacity of the input buffer.

The Length 107 indicates the foregoing entropy methods of assigning the code of the short code length to the pointer of the short data length whose frequency of appearance is high. The End Marker 103 is assigned to a 9-bit code 0x180 whose offset is equal to 0. 0x180 indicates "180" as a hexadecimal notation. In the case of the binary notation, 0x180 indicates "110000000" as shown in FIG. 3.

Although the present invention mainly relates to the compression of a character string, it will be obviously understood from the foregoing code construction that the input data is not limited to the character string so long as one unit consists of 8 bits.

It is an object of the present invention to improve the compression method such as the LZSS or the like so as to enable a method for free compression having a more excellent compression ratio to be realized. It is important to prevent such a new method from losing the advantage of the conventional compression method. For this purpose, upon expansion of the LZSS or the like, particularly, upon addition of a command, according to the present invention, the conventional method is expanded with respect to the encoding of the command. Specifically, the encoding method shown in FIG. 3 is expanded.

Although it appears that the encoding which takes into consideration of the entropy methods does not have room for expansion, an End Marker (103 in FIG. 3) is used as a unique special command. In the conventional encoding, although the end marker is assigned to the 9-bit code 0x180 whose offset is equal to 0, the end marker is expanded and used as a command in the first embodiment of the invention.

First Embodiment

Construction of the First Embodiment

FIG. 1 is a constructional diagram of the data compressing apparatus in the first embodiment of the present invention.

The apparatus shown in FIG. 1 comprises the compressing apparatus 1 and the substituting means 2. The compressing apparatus 1 is the conventional compressing apparatus such as the LZSS or the like and outputs intermediate data (character data and a pointer) 12 from the input data 11. The substituting means 2 is the additional encoder in the first embodiment and has a function of adding a command to the intermediate data that is outputted from the compressing apparatus 1 and outputting output data (character data, pointer, command) 13.

FIG. 4 is an explanatory diagram showing a fundamental construction of the command in the first embodiment.

In the first embodiment, as shown in FIG. 4(a), each command is constructed by an end marker 21 and an extension code 22. The end marker 21 is similar to the conventional end marker (code corresponding to the End Marker 103 in FIG. 3) and the 9-bit code 0x180 whose offset is equal to 0 is used as it is. This code is nothing but a code which is used in accordance with the general code method shown in FIG. 3 and is not limited thereto. When selecting any code, it is necessary to select a code which does not infringe on the codes that are assigned to the character data and pointer upon encoding.

According to the conventional data decoding method, when the compressed character data or the like is decoded and the end marker is detected, the decoder stops the decoding. However, a decoder in the first embodiment interprets the end marker as an extension command and executes the execution command. In the first embodiment, as shown in FIG. 4(b), the extension code 22 is constructed by a kind of command 22a and an operand 22b. Naturally, the kind of command 22a has to include the conventional end marker (corresponding to the End Marker 103 in FIG. 3). If many commands are necessary, the present invention copes with such a case by increasing the number of bits of the extension code 22. The operand 22b is a portion to designate a parameter corresponding to the kind of command 22a and is shown as an argument for the command.

FIG. 5 is an explanatory diagram showing an example of creation of the command.

In the first embodiment, 4 bits are assigned to the kind of command 22a, thereby enabling 16 kinds of commands to be formed.

First, when the kind of command 22a is equal to 0x0, it indicates an END command and denotes the end of output data in a manner similar to the conventional end marker. This command consists of 13 bits as a whole.

When the kind of command 22a is equal to 0x1, it indicates an RD (Repeat Data) and is a data control command. RD(B, L, N) has contents such that L character strings from a position before B strings are repeated N times. Since 7 bits are assigned to a parameter B, 8 bits are assigned to a parameter L, and 4 bits are assigned to a parameter N. Thus, the command consists of 32 bits as a whole. It is assumed that "before B strings" denotes that not only the character data but also the pointers and commands are counted in the command. Naturally, a command to count only the characters can be also formed.

When a pointer and a command other than characters are included in L data from a position before B data, a decoder error occurs so long as it is such a command. Assuming that the conventional pointer is a kind of command, an RD (Repeat Data) command has a function in which this command is expanded.

When the kind of command 22a is equal to 0x2, it indicates an RP (Repeat Pointers) command and is a pointer control command. RP(B, N) has contents such that the pointer from a position before B pointers is repeated N times. Since 7 bits are assigned to a parameter B and 4 bits are assigned to a parameter N, the command consists of 24 bits as a whole. The term "repeated N times" denotes that the character data which is outputted by such a pointer is repetitively outputted N times. Using such a method is similar to a method whereby the pointer itself is regarded as a word and this word is repetitively outputted. According to such a viewpoint, since a pointer group which gives different outputs corresponds to a dictionary in which words are collected, it is sufficient that one word is disclosed in the dictionary. If the data from a position before B data is other than the pointer, a decoder error occurs as long as it is such a command.

When the kind of command 22a is equal to 0x3, it indicates an RDP (Repeat Data and Pointers) command and is a control command of the character data and the pointer. RDP(B, L, N) has contents such that L data strings from a position before B strings are repeated N times. Since 7 bits are assigned to the parameter B, 8 bits are assigned to a parameter L, and 4 bits are assigned to the parameter N. Thus, the command consists of 32 bits as a whole. Similarly, it is assumed that "before B data strings" denotes that not only the character data but also the pointers and commands are counted in those strings. Also, in this case, when "before B data strings" is used, a command to count only the characters can be also formed. If a command to output the character data or the like exists in the counted commands, the decoder in the first embodiment also has to decode its output. Although the encoding is easily performed, a processing burden increases upon decoding.

When the kind of command 22a is equal to 0x4, it indicates an OMD (Output Modified Data) command and is a data control command. OMD(B, L, M, C) has contents such that the Mth character data among the L data strings from a position before B strings is changed to C and outputted. Since 7 bits are assigned to a parameter B, 8 bits are assigned to a parameter L, 7 bits are assigned to a parameter M, and 8 bits are assigned to a parameter C. Thus, the command consists of 43 bits as a whole. The meaning of the existence of this command is that when similar character strings are inputted, if only one character differs between them, the process becomes simpler by correcting the character string by this command. If the data amount increases due to the use of such a command, the command is not used in the first embodiment.

When the kind of command 22a is equal to 0x5, it indicates a CP (Connect Pointers) command and is a pointer control command. CP(B1, B2) has contents such that a character string that is shown by the pointer from a position before B1 pointers and a character string that is shown by the pointer from a position before B2 pointers are coupled and outputted. Since 7 bits are assigned to each of the parameters B1 and B2, the command consists of 27 bits as a whole. The meaning of the existence of this command is that the total number of bits is reduced to a value which is lower than that in the case of continuously outputting two pointers. However, a problem occurs such that the pointer after the deletion cannot be directly used by another pointer control command. In this case, if a command to decode the command itself is used in place of the pointer although the encoder is burdened, such a pointer can be indirectly used. However, if the pointer is the second or subsequent pointer which is indicative of the same character string, such a problem does not occur. If the data amount increases due to the use of such a command, the command is not used in the first embodiment. A decoder error occurs if the indicated data is other than the pointer.

When the kind of command 22a is equal to 0xD, it indicates an SPW (Set Password) command and is a password setting command. The SPW command embeds a password to the operand subsequent thereto. In the first embodiment, since 8 bytes are assigned to the password, the command consists of 77 bits as a whole. The password is verified first by an application program (not shown). If the password is not authenticated, the decoding by the decoder is inhibited. It is necessary to construct in a manner such that even if the data amount increases due to the insertion of this command, the substituting means 2 does not have authority to delete such a command.

When the kind of command 22a is equal to 0xE, it indicates an SCR (Set Copyright) command and is a copyright information setting command. The SCR command embeds copyright information into the operand subsequent thereto. In the first embodiment, since 8 bytes are assigned to the copyright information, the command consists of 77 bits as a whole. Since it is sufficient that the copyright information can specify only the owner (licensor) of the copyright, the number of bytes should not wastefully be increased or the whole data amount should not be increased by including a large amount of copyright or copyright-related information. An application program needs to have a sequence for allowing the copyright owner to consent and confirm.

When the kind of command is equal to 0xF, it indicates an SCM (Set Comment) command and is a comment setting command. The SCM command embeds a comment into the operand subsequent thereto. In the first embodiment, since 8 bytes are assigned to the comment, the command consists of 77 bits as a whole. It is also necessary to pay attention to an increase in the amount of data. It is desirable that the application program has means for displaying the comment. If a long comment of 256 bytes is permitted to the SCM command, data compression can be further accomplished to such a comment. In such a case, a comment termination (Comment Termination) command CT showing termination of the comment is used. When the substituting means 2 in the first embodiment detects the SCM command, subsequent character string data is handled as a comment. When the CT command is detected, the termination of the comment is known.

The data decoding apparatus of the first embodiment is an apparatus for decoding the output data 13 that is compressed by the data compressing apparatus. That is, it is the data decoding apparatus having a construction such that when data including the raw data, pointer and command is inputted, the command is executed and the data is returned to the raw data or the pointer, and returned to the data string regarding the raw data or the pointer as a target.

Operation of the First Embodiment

Figure 6:
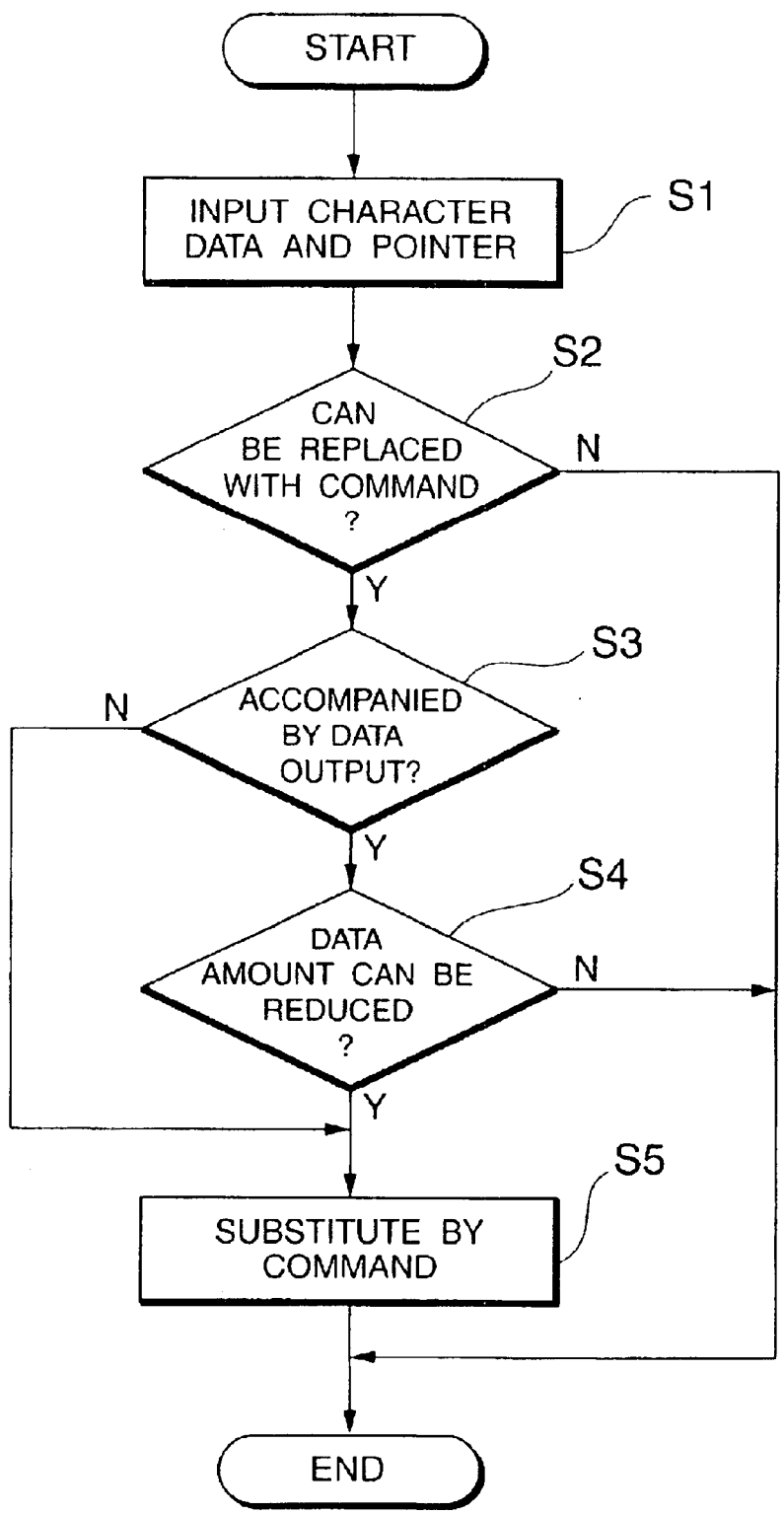
FIG. 6 is a flowchart showing the operation of the data compressing apparatus in the first embodiment.

FIG. 6 is a flowchart showing the operation of the data compressing apparatus of the present invention.

First, the compressing apparatus 1 compresses the input data 11 and outputs the character data and the pointer as the intermediate data 12. The character data and the pointer are inputted to the substituting means 2 (step S1). Thus, the substituting means 2 discriminates (determines) whether or not the command can be substituted for the character data and the pointer or whether the operator desires to add a special command (step S2). That is, it is determined whether various commands as shown in FIG. 5 can be substituted, or it is determined whether they are substituted.

If "Y (Yes)" in step S2, it is determined whether or not the command is accompanied with the output of the character data (step S3). If the command is not accompanied with the output of the character data ("N (No)" in step S3), the command is merely added and outputted (step S5). If the command is accompanied with the output of the character data ("Y" in step S3), it is determined whether or not the data amount is decreased due to it (step S4). This determination is made by comparing the data amount in the case where the command has been substituted with that in the case where the command is not substituted and checking whether the data amount in the case where the command has been substituted is smaller than that in the case where the command is not substituted. In step S4, if it is determined that the data amount decreases, step S5 follows and the substitution by the command is made. Thus, the output data 13 in which the character data, the pointer, and the command exist mixedly is outputted from the substituting means 2.

It is assumed that in the case of embedding the copyright information, the substituting means 2 dose not consider the reduction in the data amount.

FIG. 7 is an explanatory diagram of the substitution to a command.

First, FIG. 7(1) shows the case of substituting pointers showing the same character string. When the substituting means 2 detects that a first pointer P1 and a second pointer P2 indicate the same character string C, the substituting means 2 tries to replace the latter pointer P2 with the command RP(B, L) in which the former pointer P1 is repeated. The substituting means 2 calculates the sum of code lengths of both pointers and performs the substitution if it is determined that the data amount is reduced. If there is a command to operate the pointer P2 which is replaced by the substitution, this command is limited. Therefore, in the substituting process in the first embodiment, in principle, the output data of the LZSS or the like has to be replaced in order from the head. Such a determination about the substitution is made by first checking whether or not the pointers are the pointers having the same character string and, thereafter, checking the coincidence of the character string.

Subsequently, FIG. 7(2) shows the case of substituting two adjacent pointers. The two adjacent pointers P1 and P2 are replaced with one command CP(BL, L1, B2, L2) so as to integrate the two pointers. The substituting means 2 checks the output data of the LZSS or the like in order from the head. When the two adjacent pointers are found, it is determined whether or not they can be replaced with the command CP defined in the first embodiment, and only when it is determined that the data amount is reduced, the substitution is made. The substitution is made by deleting the codes of the two adjacent pointers and inserting a code corresponding to the command CP. However, it is desirable to apply such a process to the second and subsequent pointers in consideration of other commands or the like using those pointers.

Further, FIG. 7(3) shows the case of substituting a command for a pointer that is indicative of a character string in which one character differs. When the substituting means 2 detects the pointer P1 showing a character string C1 and the pointer P2 showing a character string C2 in which one character differs, the substituting means 2 tries to replace the latter pointer P2 with the command OMD(B, L, M, C) so as to change one character in the character string C1 of the former pointer P1. After the substituting means 2 detected the pointer P1 showing the character string C1, if the character string in which one character differs from that in the character string C1 exists and is constructed by a plurality of character data and pointers, the substituting means also tries to replace such a character string with the command OMD(B, L, M, C) so as to change such one character. The substituting means 2 calculates the sum of code lengths of both pointers and performs the substitution if it is determined that the data amount is reduced. Such substitution is effective when similar character strings often appear, and can contribute to a reduction in the amount data.

FIG. 8 is an explanatory diagram of output data in the first embodiment.

It is assumed that character strings of FIG. 8(a) exist as raw data in the input buffer. The raw data is data in which "ABC" is repeated six times and, subsequently, a character string "D . . . " follows. The total number of bits of the repetitive portion is equal to 144 bits because one character is constructed by one byte (8 bits).

FIG. 8(b) shows a result in which the data of (a) is encoded by the LZSS and corresponds to the output data of the compressing apparatus 1 in FIG. 1. The first character data string "ABC" consists of 27 bits ((8 bits as the number of bits of the character+1 bit as a specific bit)×3) and the number of bits is increased by 1 bit per character due to the encoding. The next output is a pointer "(3, 3)" and since an offset is equal to 3 and a length is equal to 3, this pointer consists of 11 bits (1 bit as a head bit showing Compressed Bytes 105 in FIG. 3+8 bits as the number of bits for the Offset 106+2 bits showing the Length 107). Similarly, each of the next two pointers "(6, 6) (12, 6)" consists of 13 bits, so that the total number of bits of the output data is equal to 64 bits. Therefore, a compression of about 44% is accomplished as compared with the original data.

FIG. 8(c) shows the output data in the first embodiment. Although the character data string "ABC" and the pointer "(3, 3)" are processed in a manner similar to the case of the LZSS, the next output data "RP(1, 4)" differs therefrom. As shown in the definition table of FIG. 5, this command is a pointer control command and is a command in which a one-preceding pointer is repeated four times. Since the "one-preceding pointer" is "(3, 3)" and its output data is the character data string "ABC", the output of the character data string "ABC" is eventually repeated four times and the total number of repeating times is equal to 5 times. Naturally, the output data has code contents which coincide with the input character string shown in (a). In the first embodiment, since the number of bits has been assigned as shown in FIG. 5, the pointer control command can be constructed by 24 bits. Thus, the output data consists of 62 bits in total and this means that a compression of about 43% is accomplished according to the first embodiment as compared with the original data.

FIG. 8(d) shows output data using another command according to the first embodiment. Although the character data string "ABC" is processed in a manner similar to the case of the LZSS, the next output data "RD(3, 3, 5)" differs therefrom. As shown in the definition table of FIG. 5, this command is a data control command and is a command in which three character strings from a 3-preceding character are repeated five times. That is, the character data string "ABC" is outputted five times by this command. In the first embodiment, since the number of bits has been assigned to each parameter as shown in FIG. 5, the data control command can be constructed by 32 bits. Eventually, the output data consists of 59 bits in total and this means that a compression of about 41% is accomplished according to the first embodiment as compared with the original data.

As mentioned above, in the first embodiment, the compression ratio can be further improved by a few percentage points as compared with that by the data compression method such as LZSS or the like with respect to the data as shown in FIG. 8.

The operation of a data decoding apparatus (decoder) for decoding the data which has been compressed by the data compressing apparatus in the first embodiment as mentioned above will now be described.

Figure 9:
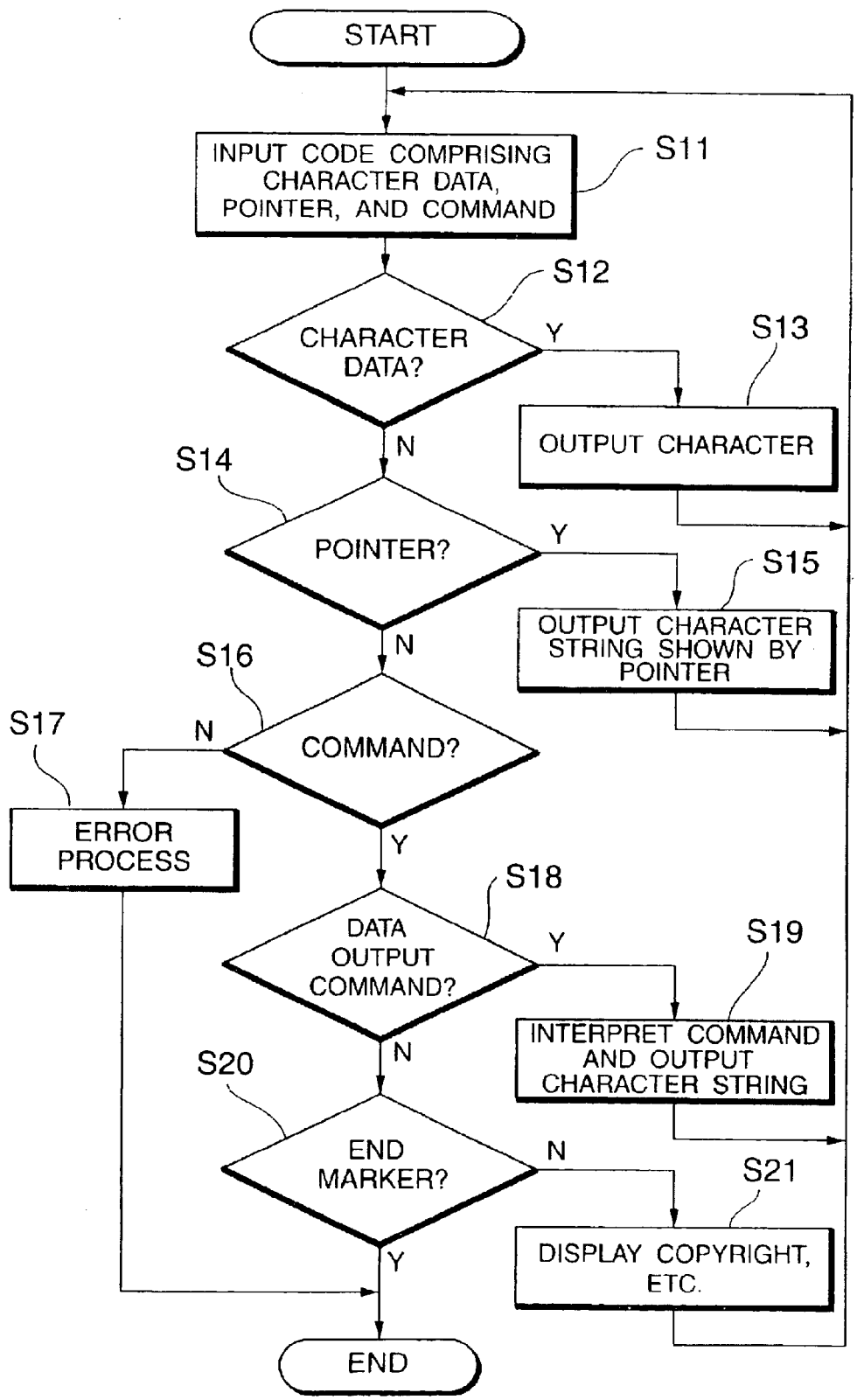
FIG. 9 is a flowchart showing the operation of a data decoding apparatus in the first embodiment.

FIG. 9 is a flowchart showing the operation of the data decoding apparatus.

First, one of codes each consisting of character data, a pointer, and a command is inputted (step S11). It is determined whether or not the code is the character data (step S12). If YES in step S12, the relevant characters are outputted (step S13) and the processing routine advances to the next code. If the code is not determined to be the character data in step S12, it is determined whether or not the code is the pointer (step S14). If YES in step S14, a character string showing the pointer is outputted (step S15) and the processing routine advances to the next code. If the code is not determined to be the pointer in step S14, it is determined whether or not the code is the command (step S16). That is, it is determined whether or not the code is a code which starts with the end marker 21. In the case of the first embodiment, it is possible to determine that the code which starts with the end marker is the command.

In step S16, if the code is not determined to the command ("N" in step S16), an error is displayed (step S17). The data decoding process is terminated at this point of time. That is, since the case where the code is none of the character data, the pointer, and the command does not exist, the data decoding process is stopped.

If the code is determined to be the command in step S16 and the command is a data output command ("Y" in step S18), the command is interpreted and the relevant character string is outputted (step S19). The processing routine advances to the next code. If the kind of command is not determined to be the data output command in step S18 ("N" in step S18), it is determined whether or not the command is the end marker (END command in FIG. 5) (step S20). If the command indicates the end marker in step S20, since the data as a target of the decoding is the last data, the data decoding process is terminated. If the command is not determined to be the end marker, since it is the password setting command SPW, copyright information setting command SCR, or comment setting command SCM, the corresponding process such as a display of the copyright information or the like is executed (step S21) and the processing routine advances to the next code.

Effects of the First Embodiment

As mentioned above, according to the first embodiment, when the character string as a target of the command coincides with the character string as a target of the character data and the character string that is indicated by the pointer or with a combination thereof, it is replaced with the character data or the pointer and the command is outputted. Therefore, for example, various information such as the copyright information and password can be also easily embedded and the free compression can be performed. The present invention can be also contributed to the improvement of the compression ratio.

In the first embodiment, when the length of the code that is assigned to the command is shorter than the length of data comprising the character data and the pointer, the character data or the pointer serving as a source is replaced with the command.

Therefore, a phenomenon such that the compression ratio of the output data in the embodiment is reduced to a value which is lower than that of the output data that is obtained by the conventional compression method such as LZSS or the like can be prevented.

Second Embodiment

According to the second embodiment of the present invnetion, the command is identified by a specific bit string.

Construction of the Second Embodiment

Since a construction of a data compressing apparatus in the second embodiment is similar to that of FIG. 1, its explanation is omitted here. A construction of encoding by the substituting means 2 in the second embodiment differs from that of the first embodiment.

FIG. 10 is an explanatory diagram of the encoding of the second embodiment.

First, output data (Compressed Stream) 201 is constructed by a compressed data string (Compressed String) 202 and an end marker (End Marker) 203. The Compressed String 202 is a set of a head bit (equal to 0) and raw data (Raw Byte) 204, or a set of a head bit (equal to 1) and a command (Command/Pointer) 205. "The head bit" denotes the specific bit (extra ID-bit) mentioned above. Although the Raw Byte 204 is constructed by 8 bits (1 byte) like ASCII, in the command (Command/Pointer) 205, a pointer (Pointer) 207 is also considered to be a kind of command. The Pointer 207 whose head bit is equal to 0 and a command (Command) 206 whose head bit is equal to 1 are identified. Such an identification is introduced because the encoding which preferentially uses the command has been used in the embodiment. However, the code length becomes long by one bit due to such an identifying process.

The Pointer 207 is constructed by an offset (Offset) 210 and a code length (Length) 211. As an Offset 210, a 6-bit offset (7 bits in total) whose head bit is equal to 1 or a 11-bit offset (12 bits in total) whose head bit is equal to 0 is prepared in consideration of the encoding efficiency. Although the 7-bit offset whose head bit is equal to 1 has been used in the encoding method in the first embodiment, since the code length becomes long by one bit in order to identify the command and the pointer as mentioned above, the offset is shortened for the purpose of compensating for it. The Length 211 indicates the entropy methods of assigning the code of the short code length to the pointer of the short data length whose frequency of appearance is high in a manner similar to the first embodiment.

The Command 206 in the second embodiment is constructed by a kind of command (Command Set) 208 and an operand (Operand) 209. In the second embodiment, since 4 bits are assigned to the kind of command, 16 commands can be designated. The Operand 209 is used to designate a parameter of the command. In the second embodiment, the End Marker 203 is one of the commands and is specifically defined by 6 bits of a code "110000".

The second embodiment has a feature such that the short code is assigned to the command as compared with the first embodiment. That is, if the head two bits of the Compressed String 202 are equal to "11", it is determined to be the command. Although the number of bits of the Raw Byte 204 is equal to 9 bits, similar to that in the first embodiment, the Pointer 207 becomes long by 1 bit and its significance consequently deteriorates. However, the second embodiment can contribute to the data compression owing to the short command in which the total number of bits is reduced.

FIG. 11 is an explanatory diagram showing a construction of a command in the second embodiment.

The second embodiment differs from the construction of the first embodiment shown in FIG. 4 with respect to a point that the code of the command is shortened to a short command code "11" 31 from the end marker 21 in the first embodiment. That is, in the first embodiment, the code 0x180 has been assigned to the End Marker 103 in FIG. 3 and the operand such as a kind of command or the like has been added to the code. In the second embodiment, the short command code "11" is assigned to the heads of all of the commands and, further, 4 bits and the number of bits corresponding to the parameter are assigned in accordance with the kind of command. This means that a status in preference to the pointer has been given to the "command" which is introduced in the present invention. By using the command in the second embodiment, the compression ratio which is fairly higher than that of the conventional compression method such as LZSS or the like having only the pointer can be accomplished. In the present embodiment, an extension code 32 (a kind of command 32a+an operand 32b) is set as shown in FIG. 11(b) in a manner similar to (the kind of command 22a+the operand 22b) in FIG. 4.

The kind of command 32a can be formed in a manner similar to the definition table of FIG. 5 described in the first embodiment.

FIG. 12 is an explanatory diagram of an example of the creation of the command in the second embodiment.

As shown in FIG. 12, the second embodiment differs from the first embodiment with respect to a point that the code "11" is assigned in place of the end marker 0x180 in the first embodiment, and other points are similar to those in the first embodiment.

Operation of the Second Embodiment

Since the data compressing operation in the data compressing apparatus in the second embodiment is similar to that in the first embodiment shown in FIG. 6, its explanation is omitted here. The operation in this example will be described also with reference to FIG. 8.

First, if the head character string "ABC" in FIG. 8(c) is encoded as shown in FIG. 10, it is performed in a manner similar to the conventional encoding. Therefore, 9 bits per character, that is, 27 bits in total, are necessary. Although the next pointer "(3, 3)" is the code "11000001101" in the first embodiment, it is the code "10100001101" in the second embodiment and can be similarly constructed by 11 bits. This is because the shorter offset is set to 6 bits in the second embodiment. The next output data "RP(1, 4)" is a command according to the second embodiment and consists of 24 bits in the first embodiment. However, according to the encoding in FIG. 10, it is "11001000000010100" and can be constructed by 17 bits. Therefore, the total number of bits is equal to 55 bits. This value is equal to 38% in comparison with the 144 bits before the compression and the compression ratio is fairly improved more than the 44% of the LZSS.

Subsequently, when output data "RD(3, 3, 5)" in FIG. 8(d) is similarly encoded, it can be expressed by 25 bits in the case of the second embodiment. The total number of bits is equal to 52 bits. This value is equal to 36% in comparison with the 144 bits before the compression, so that the compression ratio is further improved more than the 44% of the LZSS.

Since the data decoding process differs from that in the first embodiment only with respect to a point where the determination of the command is made based on whether or not the head 2 bits are equal to "11" and since other operations are similar to those in the embodiment 1, its explanation is omitted here.

Effects of the Second Embodiment

As mentioned above, according to the second embodiment, since the first bit is used to distinguish the character data, the pointer and since the command and the second bit is used to distinguish the pointer and the command, it is sufficient that the code regarding the command is shorter than that in the first embodiment and the compression ratio can be further improved.

Third Embodiment

The third embodiment of the present invention relates to a new encoding method which is called a Dynamic Code Assignment method. Such a method differs from the conventional compression methods with respect to a point that the codes that are assigned to the character string, command, and the like change dynamically as compared with the entropy coding methods. The shorter the character string is, the more it appears frequently in the entropy coding methods. Therefore, it is intended to assign the short code to such a short character string. This method is an encoding method based on what is called an experientialism.

On the other hand, the Dynamic Code Assignment method in the third embodiment is a method whereby a character string which actually and frequently appears in the data is encoded each definition unit of a predetermined data amount such as an input buffer. Since the different encoding is executed for each definition unit, a phenomenon occurs such that the same code in the output data has different meanings. According to this method, since the short code is assigned to the character string which actually and frequently appears, the compression ratio can be greatly improved.

Construction of the Third Embodiment

Since a construction of the diagram of the data compressing apparatus of the third embodiment is similar to that in FIG. 1 in the first embodiment, the similarities are not described here. The data compressing apparatus in the third embodiment differs from those of the first and second embodiments with respect to a point that the unit which is used when the substituting means 2 executes the encoding process is the definition unit of the predetermined data amount such as an input buffer unit. In the third embodiment, the entropy coding methods are applied to the character string and commands.

FIG. 13 is an explanatory diagram showing an example of the creation of the command in the third embodiment.

A foundation of the third embodiment is data definition (Data Definition) commands and a code substitution (Code Substitution) command. As shown in FIG. 13, a character string definition command SD (String Definition), a character string definition output command SDO (String Definition and Out), and a pointer definition command PD (Pointer Definition) are provided as data definition commands. The SD(B, L, M) command defines L character strings from a position where the character string is traced back by B character strings as the "Mth" character string. As will be explained below, the "Mth" is generally set to the order of the frequency of appearance of the character string in the input buffer. The SDO(B, L, M) command defines L character strings from a position where the character string is traced back by B character strings as the "Mth" character string and outputs them. The meaning of the existence of this command is that since the definition of the character string and the function of the pointer are simultaneously accomplished by one code, the code amount can be saved. The PD(M) command defines the pointer just before as the "Mth" pointer. Similarly, "the Mth" is generally set to the order of the frequency of appearance of the character string. A CS(M) command is shown as a code substitution command. The CS(M) command is a command to substitute a short code for the Mth character string or the like that is designated by the data definition command.

It is a feature of the third embodiment that if the code length of the code substitution command CS(M) itself is set to be very short and the character string, the command, or the like is replaced with the code in accordance with the order of the frequency of appearance in the input buffer, the high compression ratio can be accomplished as a whole. By making such a definition for each input buffer, a definition is made to which the local data structure of the input data is reflected. Therefore, a more proper compression can be made as compared with the conventional compression method of performing the fixed encoding to the whole input data.

FIG. 14 is an explanatory diagram showing a relation between the frequency of appearance of the same character string and the encoding in a certain input buffer.

In the case of applying the Dynamic Code Assignment method in the third embodiment, the character string which is designated by the data definition command is limited by the number of bits of a parameter M constructing the command. In the third embodiment, M is equal to 5 bits and 32 character strings can be designated. In the first and second embodiments, the input buffer is equal to 2 kbytes (a value which is set because the offset is equal to maximum 11 bits). It is also assumed in the third embodiment that the input buffer, as a definition unit, is equal to 2 kbytes. In such an input buffer, in order to optimize the number of bits of the parameter M, it is necessary to experimentally obtain the value. It is set to the value of 5 bits in the third embodiment.

As shown in FIG. 14($a$), even if a frequency of appearance (T) is high, the maximum number of character strings which can be defined is set to 32 due to the limitation of the number of bits of the parameter M. Therefore, the definition or the like of the character string having the frequency of appearance whose order M is equal to or less than 32 is not performed, and the definition is stopped based on the number of bits of the parameter M as a limitation. FIG. 14($b$) shows an example in which the definition is stopped based on the frequency of appearance (T). It is similar to the reason in which the length of matching (Match) is ordinarily set to 2 bytes in the LZSS. That is, this is because even if the character string whose frequency of appearance (T) is low is defined and the substitution is performed, a degree of contribution to the improvement of the compression ratio is small. Therefore, in the example shown in FIG. 14, when the frequency of appearance (T) is equal to or less than 2, the definition or the like is not performed. Although a plurality of pointers which designate the same character string in a certain input buffer have different offset values, in the example shown in FIG. 14, the frequency of appearance is counted as a same pointer which designates the same character string.

A determination of whether or not the pointer is the same pointer is made from a relation between an address of the character string as a target at present in the input buffer and the offset value.

FIG. 15 is an explanatory diagram showing the discriminating (determining) means for discriminating (determining) whether or not the pointer is the same pointer.

In the example shown in FIG. 15, it shows a case of determining whether or not the pointer P2 is the same as the pointer P1. The first determining condition is that the character strings that are shown by the two pointers P1 and P2 show the same number of characters and this value coincides with the number of characters of a character string S1. The second determining condition is that a difference between relative addresses Padr and Cadr which the two pointers P1 and P2 have in the input buffer coincides with a difference between offset values OffsetadrP and OffsetadrC which the two pointers P1 and P2 have. In order to show that the pointer as an examination target at present is P2, a character "C (Current)" is used.

FIG. 16 is an explanatory diagram showing an example of creation of a definition table of character strings and the like.

The substituting means 2 forms the definition table for each input buffer. The definition command which defines the character string existing in the designated order M is listed together with its parameter. The definition command of each designated order shows a different character string or pointer. For example, the definition command SDO(B, L, M) of the designated order 1 and the definition command SDO(B, L, M) of the designated order 4 show the different character strings. A valid/invalid flag is a flag showing whether the corresponding definition is valid or invalid. In the third embodiment, the definition commands of the designated orders down to 16 are the valid definition (value is equal to 1) in accordance with FIG. 11(b) in the second embodiment. The definition table can be provided in a memory which can be used by an application program. In this case, if the processed codes are stored so that the designated order M does not overlap, the memory amount can be reduced.

FIG. 17 is an explanatory diagram showing an example of the encoding in the third embodiment.

The encoding method in the third embodiment can be compared with that in the second embodiment in FIG. 10.

Output data (Compressed Stream) 301 is constructed by a compressed data string (Compressed String) 302 and an end marker (End Marker) 303. The Compressed String 302 is a set of a head bit (equal to 0) and raw data (Raw Byte) 304, or a set of a head bit (equal to 1) and a command (Command/Pointer) 305. Although the Raw Byte 304 is constructed by 8 bits (I byte) like ASCII, in the Command/Pointer 305, a pointer (Pointer) 307 is also considered to be a kind of command, and the pointer (Pointer) 307 whose head bit is equal to 0 and a command (Command) 306 whose head bit is equal to 1 are identified.

The pointer (Pointer) 307 is constructed by an offset (Offset) 310 and a code length (Length) 311. As an Offset 310, a 6-bit offset (7 bits in total) whose head bit is equal to 1 or a 11-bit offset (12 bits in total) whose head bit is equal to 0 is prepared in consideration of the encoding efficiency. The Length 311 is the entropy methods of assigning a code of a short code length to the pointer of a short data length in which a frequency of appearance is high in a manner similar to the first and second embodiments.

The third embodiment is mainly characterized by the encoding of a command. The Command 306 in the third embodiment is constructed by a kind of command (Command Set) 308 and an operand (Operand) 309. When the kind of command 308 is encoded, the entropy methods are used. This is because it is considered that use frequencies of commands are varied remarkably. For example, a code "00" is assigned to the CS command (314 in the Command Set 312 in FIG. 17). This is because it is considered that such a code appears most frequently for the substitution for the pointer or the like. Subsequently, a code "01" is assigned to the SDO command (315 in FIG. 17). Since the definition command is ordinarily used up to the maximum value of the designated order M, its frequency of appearance is high. Subsequently, a code "10" is assigned to the PD command (316 in the diagram). A possibility that this command is used as a substitution for the pointer is high. If all commands frequently appear, the method for simply assigning 4 bits in the second embodiment shown in FIG. 10 can be also used.

In the third embodiment, 22 kinds of commands are defined and a code "11111111" is assigned to the END command. The entropy methods can be also used with respect to the Operand 309 (313 in the diagram). It is desirable that the higher the parameter M assigned to the designated order is, the shorter the code which is set (shown in 318 in the diagram). The designated orders down to 22 are assured here. The entropy methods can be used with respect to the other parameters. The method used in this case is slightly different from the entropy methods which are applied when the number of characters of the pointer is encoded. This is because the shortest length is equal to 2 in the LZSS since the pointer length is set to 2 bytes and since there is no need add such a limitation to the command code or parameter in the third embodiment.

Operation of the Third Embodiment

Figure 18:
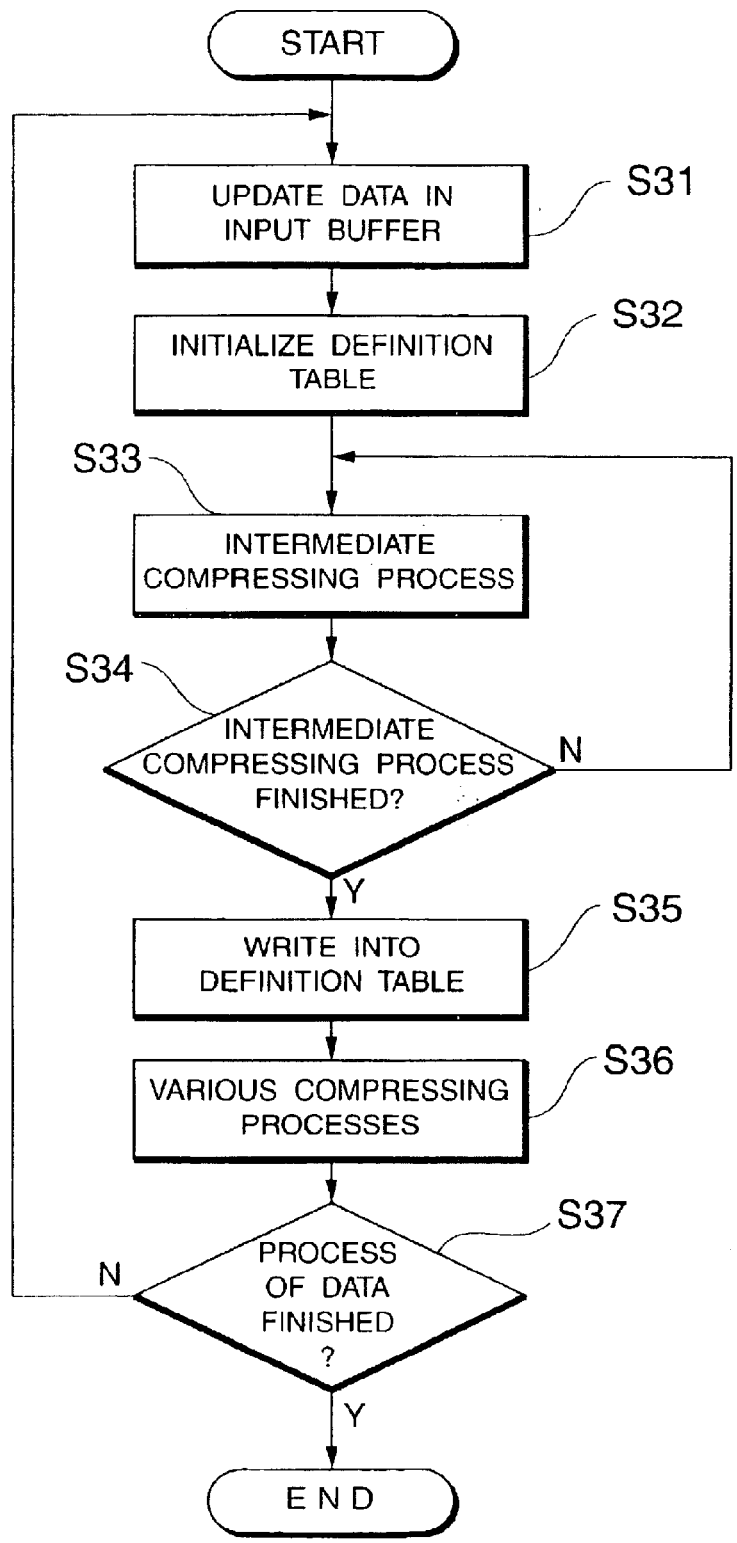
FIG. 18 is a flowchart showing the operation of the third embodiment.

FIG. 18 is a flowchart showing the operation of the substituting means 2 in the third embodiment.

First, when a processing routine is started and the data in the input buffer is updated (step S31), the definition table is initialized (step S32). The initialization of the definition table is made by invalidating the valid/invalid flag shown in FIG. 16 (a value 0 is written). Subsequently, the raw data in the input buffer is compressed by the compressing apparatus 1 (step S33). Character data or pointer is outputted as an intermediate compression output (step S34). That is, the compressing process in steps S33 and S34 corresponds to the compressing process according to the conventional LZSS.

Subsequently, the substituting means 2 writes data into the definition table (step S35). That is, the frequency of appearance of the character string in the target input buffer is obtained and the data is written into the definition table in a manner such that the higher the frequency of appearance of the character string is, the more the designated order (M) is raised. That is, in FIG. 16, the code of the definition command corresponding to the character string of each designated order (M) is written and the valid/invalid flag is validated (a value 1 is written). The substituting means 2 executes various compressing processes (step S36). The various compressing processes are, for example, a substituting process of the pointers as shown in FIG. 7, the embedding process of the copyright information or the like, and further, the setting of the code substitution command.

FIG. 19 is an explanatory diagram of the setting of the code substitution command.

FIG. 19(a) shows a case of handling only one pointer. There are " . . . P1 . . . P1 . . . P1 . . . P1 . . . " as character data or the like as intermediate data 12, and " . . . SDO . . . CS . . . CS . CS . . . " is outputted as output data 13 by using the substituting means 2. In the third embodiment, the first pointer "P1" is replaced with the character string definition output command SDO (refer to 1 in FIG. 19). If the pointer definition command PD is used, one pointer is duplicated. However, in this case, since the command to operate such a pointer can be used, it is necessary to discriminate on the basis of the final compression ratio as a reference. The second and subsequent pointers are replaced with the code substitution commands CS (refer to 2 to 4 in FIG. 19). Although the pointers P1 have different offsets, they are handled as a pointer which is indicative of the same character string.

FIG. 19(b) shows the case of handling a plurality of pointers. The first pointers "P1" and "P2" in the intermediate data 12 are replaced with the character string definition output commands "SD01" and "SDO2" in the output data 13, respectively. The subsequent pointers "P1" and "P2" are replaced with code substitution commands "CS1" and "CS2", respectively. In the case of handling a plurality of pointers, each pointer can be also independently defined and replaced.

Returning to FIG. 18, it is determined whether or not all the data has been processed (step S37). If the data in the input buffer to be processed exists, the processes from step S31 mentioned above are repeated. If all the data has been processed, the data compressing process is finished.

How the decoder handles the output data that is compressed by the data compressing apparatus in the third embodiment will now be described.

Since the operation of the decoder is fundamentally similar to that of FIG. 9, it will be explained with reference to FIG. 9. The third embodiment differs from the operation shown in FIG. 9 with respect to the handling of the data output command. For example, the commands other than the data output command are handled so as to execute the display of the copyright information or the like (step S21) in the cases of the first and second embodiments. In the third embodiment, in the case of the data definition command (for example, SDO command), data is written into the definition table as shown in FIG. 16. That is, the definition table is formed again for each predetermined data unit such as an input buffer. The code substitution command (for example, CS command) is handled as a data output command ("Y" in step S18 in FIG. 9). That is, the data definition command corresponding to the designated order (M) as a parameter of the code substitution command is referred to in the definition table and the defined character string is outputted. In this case, the valid/invalid flag of the designated order M is referred to and if it is invalid, a decoder error occurs.

In the third embodiment, the designated order M is determined based on the frequencies of appearance, as a reference, of a plurality of pointers which designate the same character string and whose offsets are different. However, other references can be used. For example, there is a method whereby a product of the number of character strings and the number of pointers is considered as a total amount of data and it is used as a reference. However, ordinarily, since the shorter the data is, the higher the frequency of appearance is, a case occurs where if such a reference is used, the degree of contribution to the improvement of the compression ratio is small. There is also a method whereby a product of the number of codes of the character strings and the number of pointers is considered as a total amount of codes and it is used as a reference. However, it is considered that when the number of pointers is small, the compressing effect is also small.

Effects of the Third Embodiment

As mentioned above, according to the third embodiment, in the case where the character string that is designated by the specific pointer coincides with the character strings that is designated by a plurality of other pointers, the process for replacing the specific pointer with the definition command and replacing the plurality of other pointers with the code substitution commands corresponding to the definition command is executed for each predetermined data unit such as an input buffer. Therefore, the short code can be dynamically assigned to the character string which actually and frequently appears. Thus, the local structure of the data structure can be accurately grasped and the compression ratio can be further improved.

According to the third embodiment, in the case where each of a plurality of commands is constructed by the kind of command and the operand, the encoding is performed for gradually increasing the code length in accordance with the kind of each command or the parameter of each operand. Therefore, the short code can be assigned to the command which appears frequently, and as a result, the compression ratio can be further improved.

According to the third embodiment, among the character strings existing in the predetermined data unit such as an input buffer or the like, the character string which appeared first is selected as a character string that is designated by the specific pointer. Therefore, the substitution to the definition command or the substitution to the code substitution command can be easily performed.

According to the third embodiment, if a plurality of definition commands are set, the frequencies of appearance of a plurality of character strings that are instructed by the pointers which are replaced with those definition commands in the predetermined data unit such as an input buffer are counted and the definition table in which the definition commands have been disclosed is formed in the order of the frequencies of appearance. Therefore, the short code can be dynamically assigned to the character string which actually and frequently appears. Thus, the compression ratio can be further improved.

According to the third embodiment, it is determined whether or not the number of characters of the character string that is designated by the specific pointer coincides with that of the character string designated by another pointer. It is also determined whether or not the difference between the address of the character string that is designated by the specific pointer in the predetermined data unit such as an input buffer and the address of the character string that is designated by the other pointer coincides with the difference between the offset value which the specific pointer has and the difference between the offset value which the other pointer has. If they coincide, it is determined that the character string that is designated by the specific pointer and the character string that is designated by the other pointer coincide. Therefore, it can be easily determined whether or not the character strings that are designated by the different pointers coincide.

Although the character data and the pointer according to the conventional LZSS or the like have been used as intermediate data 12 which is inputted to the substituting means 2 in each of the above-described embodiments, the compression method of the compressing apparatus 1 is not limited to the LZSS. Arbitrary data can be used as intermediate data 12 so long as the data comprises the raw data such as character data or the like and the pointer which is inputted to the substituting means 2.

According to the present invention as described above, when the data string as a target of the command coincides with the data string as a target of the raw data and the data string that is indicated by the pointer or a combination thereof, the command is outputted in place of the raw data or the pointer. Therefore, for example, various information such as copyright information and password can be also easily embedded and the free compression can be made. It is also possible to contribute to the improvement of the compression ratio.

The present invention is not limited to the foregoing embodiments, and it is to be understood that many modifications and variations are possible within the spirit and scope of the appended claims of the present invention.

What is claimed:

1. A data compressing apparatus for outputting raw data, a pointer, and a command from a data string, said data compressing apparatus comprising:
   substituting means for outputting the command in place of the raw data or the pointer when a data string as a target of the command coincides with a data string as a target of the raw data and a data string indicated by the pointer or a combination thereof.

2. The data compressing apparatus according to claim 1, wherein when a code length assigned to the command is shorter than a length of data comprising the raw data and the pointer, said substituting means replaces the raw data or the pointer serving as a source with the command.

3. The data compressing apparatus according to claim 1, wherein the command is constructed by a command code and an extension code.

4. The data compressing apparatus according to claim 3, wherein the extension code is constructed by a code which is indicative of a kind of command and an operand.

5. The data compressing apparatus according to claim 1, wherein
a first bit is used to distinguish the raw data, the pointer, and the command, and
a second bit is used to distinguish the pointer and the command.

6. The data compressing apparatus according to claim 5, wherein when each of a plurality of commands is constructed by a kind of command and an operand, said substituting means executes encoding for gradually increasing a code length in accordance with the kind of each command.

7. The data compressing apparatus according to claim 5, wherein when each of a plurality of commands is constructed by a kind of command and an operand, said substituting means executes encoding for gradually increasing the code length in accordance with a parameter of each operand.

8. The data compressing apparatus according to claim 1, wherein said substituting means executes, for each predetermined data unit, a process for, when a data string designated by a specific pointer coincides with data strings designated by a plurality of other pointers, replacing the specific pointer with a definition command and replacing the plurality of other pointers with a code substitution command corresponding to the definition command.

9. The data compressing apparatus according to claim 8, wherein among the data strings existing in the predetermined data unit, the data string which appears first is selected as a data string designated by the specific pointer.

10. The data compressing apparatus according to claim 8, wherein when a plurality of definition commands are set, said substituting means counts frequencies of appearance, in the predetermined data unit, of a plurality of data strings designated by the pointer with replaced with the plurality of definition commands, and forms a definition table in which the definition commands have been disclosed in an order of the frequencies of appearance.

11. The data compressing apparatus according to claim 10, wherein the definition table is newly formed for each predetermined data unit.

12. The data compressing apparatus according to claim 8, wherein said substituting means determines whether or not a data amount of the data string designated by the specific pointer coincides with a data amount of a data string designated by one of the plurality of other pointers determines whether a difference between an address of the data string designated by the specific pointer in the predetermined data unit and an address of the data string designated by the one of the plurality of other pointers coincides with a difference between an offset value which the specific pointer has and an offset value which the one of the plurality of other pointers, and if they coincide, determines that the data string designated by the specific pointer coincides with the data string designated by the one of the plurality of other pointers.

13. A data decoding apparatus in which including raw data, a pointer, and a command is inputted,
wherein the command is inputted as a substitute for raw data or a pointer from a data string when a data string as a target string of the command coincided with a data string as a target of the raw data and a data string indicated by the pointer or a combination thereof, and
wherein when the data including the raw data, the pointer and the command is inputted to said data decoding apparatus, said data decoding apparatus is operable to execute the command, to return the inputted data to the raw data or the pointer, and to return the raw data or the pointer to a target data string.

14. A data decoding apparatus, wherein
when data which has been compressed for each predetermined data unit is inputted in a manner such that when a data string, which is data including raw data, a pointer and a command and which is designated by a specific pointer, coincides with data strings which are designated by a plurality of other pointers, the specific pointer is replaced with a definition command and the plurality of other pointers are replaced with a code substitution command corresponding to the definition command, and
the code substitution command is returned to the definition command, the definition command is returned to the raw data or the pointer, and the raw data or the pointer is returned to the data string as a target for each predetermined data unit.

* * * * *